(12) United States Patent
Hsu et al.

(10) Patent No.: US 7,973,397 B2
(45) Date of Patent: Jul. 5, 2011

(54) PACKAGE SUBSTRATE HAVING EMBEDDED SEMICONDUCTOR CHIP AND FABRICATION METHOD THEREOF

(75) Inventors: Shin-Ping Hsu, Hsin-Chu (TW); Kan-Jung Chia, Hsin-Chu (TW)

(73) Assignee: Unimicron Technology Corp., Taoyuan (TW)

( * ) Notice: Subject to any disclaimer, the term of this patent is extended or adjusted under 35 U.S.C. 154(b) by 195 days.

(21) Appl. No.: 12/483,528

(22) Filed: Jun. 12, 2009

(65) Prior Publication Data
US 2009/0309202 A1 Dec. 17, 2009

(30) Foreign Application Priority Data
Jun. 13, 2008 (TW) .............................. 97122052 A

(51) Int. Cl.
*H01L 23/02* (2006.01)
*H01L 27/146* (2006.01)

(52) U.S. Cl. . 257/680; 257/678; 257/698; 257/E21.505; 257/E21.192; 257/432; 257/433; 257/434; 257/444

(58) Field of Classification Search .................. 257/678, 257/680, 693, 698, E21.505, E21.192, E33.077, 257/257/E31.096, E23.001–E23.194, 414, 432, 433, 434, 444

See application file for complete search history.

(56) References Cited

U.S. PATENT DOCUMENTS

| | | | | |
|---|---|---|---|---|
| 5,081,347 A | * | 1/1992 | Matsumoto | 257/437 |
| 7,282,788 B2 | * | 10/2007 | Chen | 257/680 |
| 2008/0191335 A1 | * | 8/2008 | Yang et al. | 257/680 |
| 2009/0026558 A1 | * | 1/2009 | Bauer et al. | 257/414 |

* cited by examiner

*Primary Examiner* — Jasmine J Clark
(74) *Attorney, Agent, or Firm* — Peter F. Corless; Steven M. Jensen; Edwards Angell Palmer & Dodge LLP

(57) ABSTRACT

A packaging substrate having a semiconductor chip embedded and a fabrication method thereof are provided. The method includes forming a semiconductor chip in a through cavity of a core board and exposing a photosensitive portion of the semiconductor chip from the through cavity; sequentially forming a first dielectric layer and a first circuit layer on the core board, the first circuit layer being electrically connected to the electrode pads of the semiconductor chip; forming a light-permeable window on the first dielectric layer to expose the photosensitive portion of the semiconductor chip and adhering a light-permeable layer onto the light-permeable window, thereby permitting light to penetrate through the light-permeable layer to reach the photosensitive portion. Therefore, when fabricated with the method, the packaging substrate dispenses with conductive wires and dams and thus can be downsized.

6 Claims, 4 Drawing Sheets

PACKAGE SUBSTRATE HAVING EMBEDDED SEMICONDUCTOR CHIP AND FABRICATION METHOD THEREOF

FIELD OF THE INVENTION

The present invention relates to a packaging substrate and a fabrication method thereof, and more particularly, to a packaging substrate having an embedded semiconductor chip and a fabrication method thereof.

DESCRIPTION OF RELATED ART

A package with a photosensitive semiconductor chip is often integrated onto an electronic device as a printed circuit board to manufacture a variety of electronics sensing products, including digital cameras, digital video cameras, optical mice, and mobile phones. Nowadays, the structure of a packaging substrate with a photosensitive semiconductor chip, having an image sensor element like a CMOS or CCD, attached to a substrate, wherein the photosensitive chip is electrically connected to the substrate via bonding wires. A light-permeable layer is then formed on the semiconductor chip so as to allow the photosensitive chip to receive image light for activating the electronic sensing elements. FIGS. 1A to 1D show a conventional fabrication method for a packaging substrate of a photosensitive semiconductor chip.

Referring to FIG. 1A, a core board 10 includes a conductive through hole 100 with an internal structure finished by drilling, metal plating, hole plugging, circuit formation and so on. The core board 10 has a first surface 10a and an opposite second surface 10b and the first and second surfaces 10a and 10b contain conductive pads 101.

A semiconductor chip 11 is provided with an active surface 11a and an opposite inactive surface 11b as shown in FIG. 1B. The active surface 11a has electrode pads 110 and a photosensitive portion 111, and the inactive surface 11b of the semiconductor chip 11 is attached to the first surface 10a of the core board 10 in the central area free of conductive pads 101. Next, based on FIG. 1C, the electrode pads 110 are electrically connected to the conductive pads 101 on the first surface 10a of the core board 10 by conducting wires 12 made of gold, and a dam 13 is formed around the semiconductor chip 11 on the core board 10, as well as around the conducting wires 12. In FIG. 1D, a light-permeable layer 14 is further disposed on the dam 13 to seal the semiconductor chip 11, the height of the dam 13 preventing the light-permeable layer 14 from being in contact with the semiconductor chip 11. The dam 13 extends fully around the semiconductor chip 11 together with the light-permeable layer 14 and the core board 10 collective form a sealed cavity that protects the semiconductor chip 11, wherein the light-permeable layer 14 is made of glass for allowing light to penetrate through it and reach the photosensitive portion 111. Moreover, solder balls 15 are attached to the conductive pads 101 on the second surface 10b of the core board 10 for the package structure to be integrated onto a printed circuit board.

However, in the conventional structure described above, it is necessary to process an internal portion of the core board 10 to form the conductive vias 100, which complicates the fabrication process.

Additionally, in order to maintain stability of the photosensitive portion 111 and parallel alignment of the light-permeable layer 14 with the photosensitive portion 111, the core board 10 must have adequate thickness to avoid warping that could cause signal distortion. As a result, the increased thickness works against providing a compact-sized packaging substrate for miniaturized products, and manufacturing the dam 13 (with a height ranging from 50 um to 200 um) such that it can provide a level plane with respect to the core board 10 increases the processing difficulty.

In addition, since there is a need to reserve some space on the core board 10 to form the dam 13, the overall layout area of the packaging substrate will be undesirably increased. Further, since disposal of the conducting wires 12 causes them to extend a certain height above the semiconductor chip 11, the height of the dam 13 must be greater than the top of the conducting wires 12. Thus, the overall height of the package structure increases.

In conventional fabrication methods, both the overall area and height of the packaging substrate have to be so expanded to such an extent that this package structure in not optimal or suitable for use in many miniaturized electronics products.

Therefore, it is desirable to provide a packaging substrate with a photosensitive semiconductor chip and a fabrication method thereof to overcome the above-mentioned drawbacks.

SUMMARY OF THE INVENTION

In light of the disadvantages in the conventional technique, the present invention provides a packaging substrate having an embedded semiconductor chip and a fabrication method thereof to prevent the packaging substrate from warping.

The present invention also provides a compact-sized packaging substrate embedded with a semiconductor chip and a fabrication method thereof.

According to the present invention, the method for fabricating the packaging substrate having the embedded semiconductor chip comprises: providing a core board having a first surface and an opposite second surface, wherein the core board has a through cavity penetrating the first and second surfaces; providing a semiconductor chip having an active surface and an opposite inactive surface, wherein the active surface has a photosensitive portion and a plurality of electrode pads, fixing the semiconductor chip into the through cavity, such that the active surface is exposed from the first surface of the core board and the inactive surface is exposed from the second surface of the core board; forming a first dielectric layer on the active surface and the first surface of the core board, forming a second dielectric layer on the inactive surface and the second surface of the core board, also forming a plurality of conductive through holes penetrating the core board and the first and second dielectric layers, wherein the first dielectric layer has a plurality of vias to expose the electrode pads; forming a first circuit layer on the first dielectric layer and forming a second circuit layer on the second dielectric layer, also forming a plurality of first conductive vias in the vias to electrically connect the first circuit layer and the electrode pads, further forming a plurality of conductive through holes in the through holes to electrically connect the first circuit layer and the second circuit layer; and forming a light-permeable window in the first dielectric layer to expose the photosensitive portion.

Based on the above-mentioned method, fabrication of the first circuit layer, the second circuit layer, the first conductive vias, and the conductive through holes may further contain the following processes. First, a conductive seed-layer is formed on the first and the second dielectric layer, walls of the vias, and walls of the through holes, followed by forming a resist layer on the conductive seed-layer on the first and the second dielectric layers, and forming a plurality of open areas in the resist layers to expose the conductive seed-layer on the walls of the vias, the walls of through holes, and portions of the first and the second dielectric layer. Next, a plurality of conductive through holes are formed in the through holes, a first circuit layer is formed on the first dielectric layer in the open areas, a plurality of first conductive vias are formed in the vias, and a second circuit layer is formed on the second dielectric layer in the open areas through the conductive seed-layer by electroplating, which is succeeded by removing the resist layers and the conductive seed-layer covered by the resist layers.

In the aforementioned method, the gap between the walls of the through cavity and the semiconductor chip may be filled with an adhesive to fix the semiconductor chip.

Additionally, the method may further comprise forming an adhesive layer on the first circuit layer and the first dielectric layer, and attaching a light-permeable layer onto the adhesive layer to seal the light-permeable window, wherein the light-permeable layer is made of glass or another light-permeable material without any specific limitation.

In addition, the method can include forming a solder mask layer on the second dielectric layer and the second circuit layer, and forming a plurality of openings in the solder mask layer to expose portions of the second circuit layer to serve as conductive pads. The conductive pads could further be combined with solder balls to serve for electrically connecting to external electronics devices.

In an alternative embodiment of the present invention, the fabrication method may include forming a built-up structure on the second dielectric layer and the second circuit layer, wherein the built-up structure has at least a third dielectric layer, a third circuit layer disposed the third dielectric layer, and a plurality of second conductive vias electrically connecting the second circuit layer and the third circuit layer. Moreover, a plurality of openings are formed in the solder mask layer to expose portions of the outermost third circuit layer to serve as conductive pads. The conductive pads could further be combined with solder balls to serve for electrically connecting to external electronics devices.

The present invention also provides a packaging substrate having an embedded semiconductor chip, comprising: a core board having a first surface and an opposite second surface, and a through cavity penetrating the first and second surfaces; the embedded semiconductor chip disposed in the through cavity and having an active surface and an opposite inactive surface, the active surface having a photosensitive portion and a plurality of electrode pads and being at the same side as the first surface of the core board, while the inactive surface being at the same side as the second surface of the core board; a first dielectric layer formed on the active surface and the first surface of the core board, the first dielectric layer having a light-permeable window to expose the photosensitive portion; a first circuit layer formed on the first dielectric layer and having a plurality of first conductive vias disposed in the first dielectric layer for electrically connecting to the electrode pads; a second dielectric layer formed on the inactive surface and the second surface of the core board; a second circuit layer formed on the second dielectric layer; and a plurality of conductive through holes penetrating the core board, the first and second dielectric layers, and electrically connecting the first and second circuit layers.

In the aforesaid packaging substrate structure with an embedded semiconductor chip, an adhesive can fill the gap between the walls of the through cavity and the semiconductor chip. Also, the structure can include an adhesive layer and a light-permeable layer, with the adhesive layer being disposed on the first dielectric layer and the first circuit layer, and the light-permeable layer being disposed on the adhesive layer to seal the light-permeable window. The light-permeable layer may be made of glass or other light-permeable material without any specific limitation.

The packaging substrate structure may further comprise a solder mask layer disposed on the second dielectric layer and the second circuit layer, wherein the solder mask layer has a plurality of openings to expose portions of the second circuit layer to serve as conductive pads. Alternatively, a built-up structure may be disposed on the second dielectric layer and the second circuit layer, wherein the built-up structure has at least a third dielectric layer, a third circuit layer disposed the third dielectric layer, and a plurality of second conductive vias electrically connecting the second circuit layer and the third circuit layer, and a solder mask layer is further formed on the built-up structure. Moreover, the solder mask layer may be formed with a plurality of openings to expose portions of the outermost third circuit layer for serving as conductive pads, which may be possibly combined with solder balls to thereby connect to external electronics devices.

In light of the above-mentioned disclosure, the packaging substrate with an embedded semiconductor chip and the fabrication method thereof is achieved by providing conductive through holes, a first and a second circuit layer for the semiconductor chip to be electrically connected to a core board, and forming a light-permeable layer by means of an adhesive layer. Compared to the conventional art using conducting wires and a dam, the present invention offers a packaging substrate with a reduced structural height and area and therefore allows a package with smaller volume. Moreover, the warp effect of the packaging substrate can be eliminated in the present invention because pressure imposing upon the edges of core boards coming from the dam no longer exists during the manufacturing process.

BRIEF DESCRIPTION OF DRAWINGS

FIGS. 2J' and 2K' are cross-sectional views illustrating another embodiment of the present invention.

DETAILED DESCRIPTION OF PREFERRED EMBODIMENTS

The following embodiments are provided to illustrate the disclosure of the present invention. These and other advantages and effects will be apparent to those ordinarily skilled in the art after reading the disclosure of this specification.

FIGS. 2A to 2K are cross-sectional views showing a method for fabricating a packaging substrate having an embedded semiconductor chip according to one embodiment of the present invention.

As shown in 2A, a core board 20 is provided with a first surface 20a and an opposite second surface 20b, wherein the core board 20 has a through cavity 201 penetrating it, including the first surface 20a and second surface 20b, and wherein the core board 20 is an insulating board or a packaging substrate with a finished circuit layout. Descriptions of numerous fabrication techniques for a packaging substrate are omitted herein since they are commonly known in the industry and are not relevant to the technical feature of the present invention.

Figure 1A:
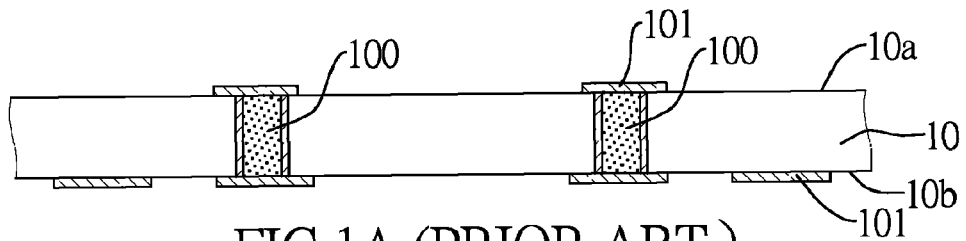
FIGS. 1A to 1D are cross-sectional diagrams showing a conventional method for fabricating a package structure with a photosensitive semiconductor chip.
Figure 1B:
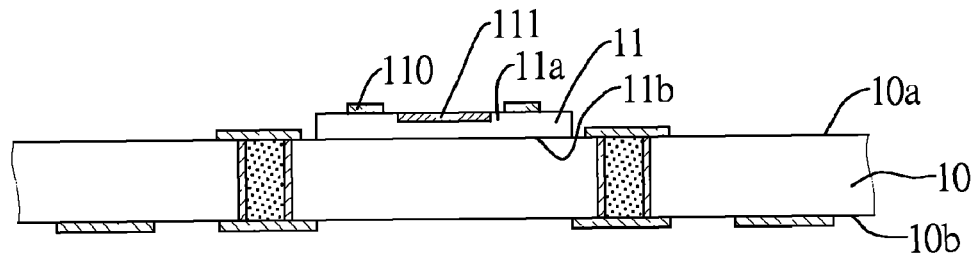
Figure 1C:
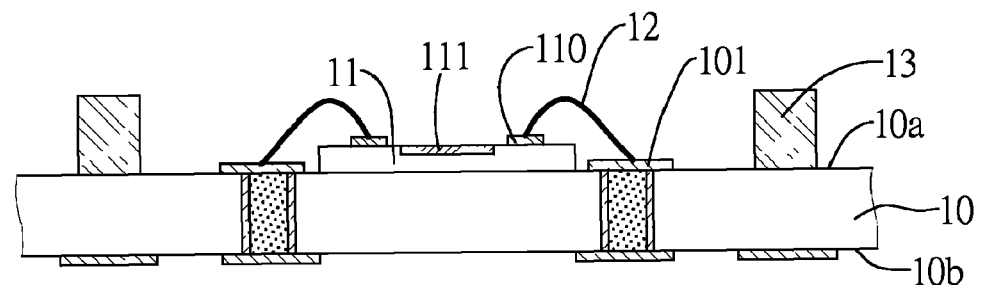
Figure 1D:
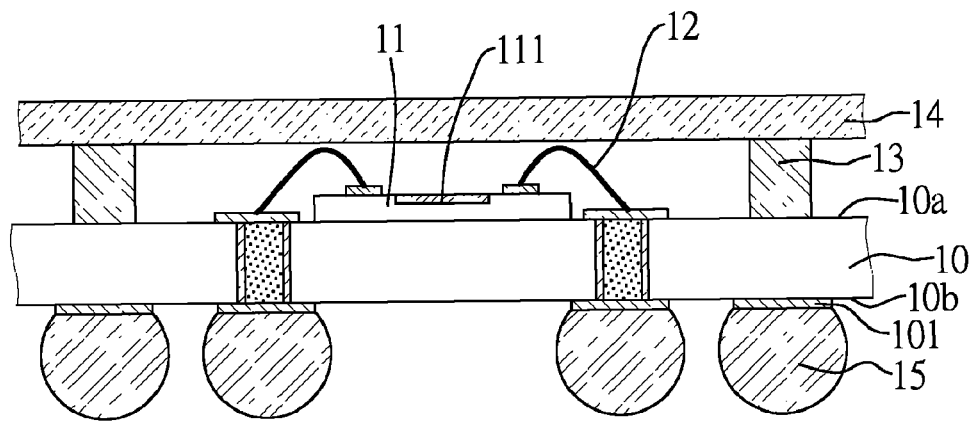
Figure 2A:
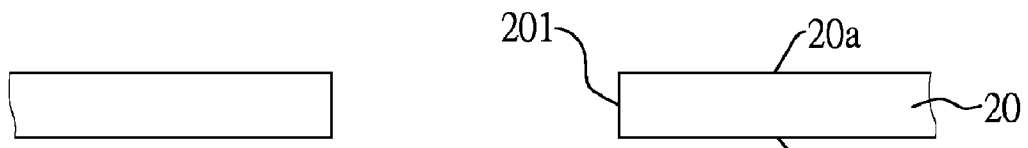
FIGS. 2A to 2K are cross-sectional views showing a method for fabricating a packaging substrate having an embedded semiconductor chip according to one embodiment of the present invention.
Figure 2B:
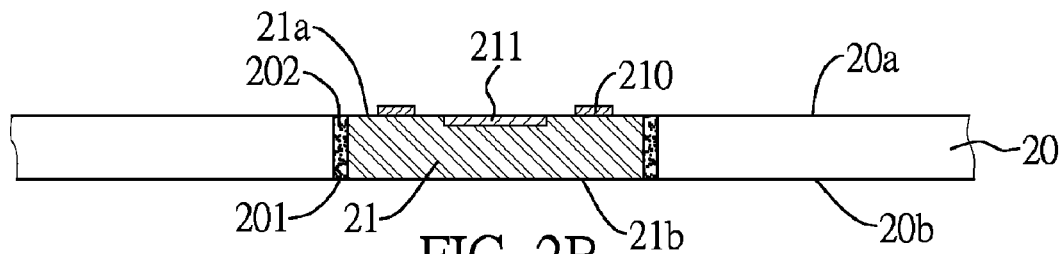

Next, as shown in FIG. 2B, a semiconductor chip 21 provided with an active surface 21a and an opposite inactive surface 21b is disposed into the through cavity 201, wherein the active surface 21a has a photosensitive portion 211 and a plurality of electrode pads 210. An adhesive 202 fills the gap between the semiconductor chip 21 and the walls of the through cavity 201 to fix the semiconductor chip 21 so that the active surface 21a is exposed from the first surface 20a while the inactive surface 21b is exposed from the second surface 20b of the core board 20. Likewise, descriptions of numerous means to fix a semiconductor chip 21 to a core board 20 are omitted herein since they are commonly known in the industry and are not relevant to the technical features of the present invention.

Figure 2C:
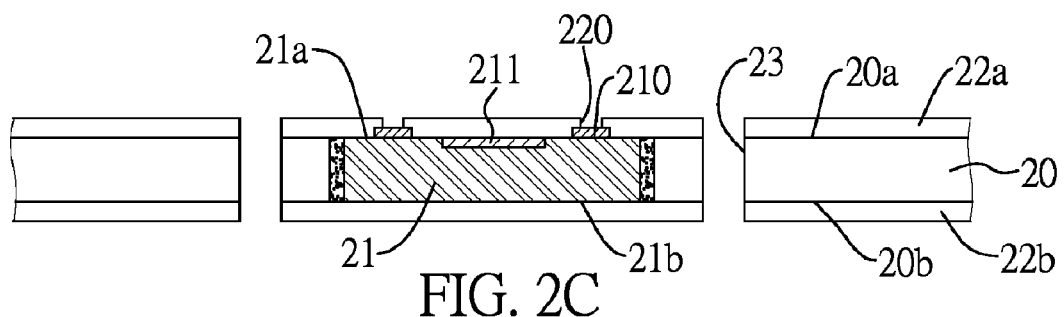

Referring to FIG. 2C, a first dielectric layer 22a is formed on the active surface 21a of the semiconductor chip 21 and the first surface 20a of the core board 20, and a second dielectric layer 22b is formed on the inactive surface 21b of the semiconductor chip 21 and the second surface 20b of the core board 20. Additionally, a plurality of through holes 23 are formed that penetrate the core board 20, the first dielectric layer 22a and the second dielectric layer 22b, and a plurality of vias 220 are formed to expose a portion of the surface of the electrode pads 210.

Figure 2D:
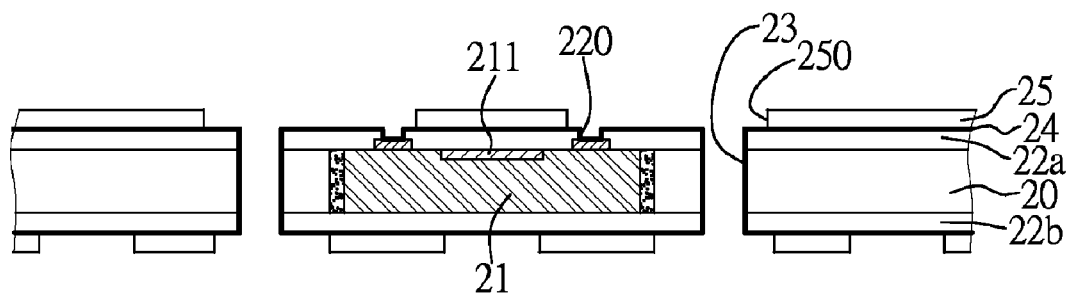

Referring to FIG. 2D, a conductive seed-layer 24 is formed on the first and the second dielectric layers 22a and 22b, the walls of the vias 220 of the dielectric layer, and the walls of the through holes 23. Then, a resist layer 25 is formed on the conductive seed-layer 24 of the first dielectric layer 22a and the second dielectric layer 22b, wherein a plurality of open areas 250 in the resist layers are formed to expose the conductive seed-layer on the walls of the vias 220, the walls of the through holes 23, and portions of the first and second dielectric layers 22a, 22b. At this point, the first dielectric layer 22a of the photosensitive portion 211 is still covered by the resist layer 25.

The conductive seed-layer 24 can be formed of a pure metal, alloy, or be a multi-deposited metallic layer. The resist layer 25 can be formed of a dry film photoresist, liquid photoresist and so on. The resist layer 25 can be formed on the conductive seed-layer 24 through printing, spin coating or laminating. Later, the open areas 250 can be formed in the resist layer 25 by means of patterning upon exposure, developing, and so on.

Figure 2E:
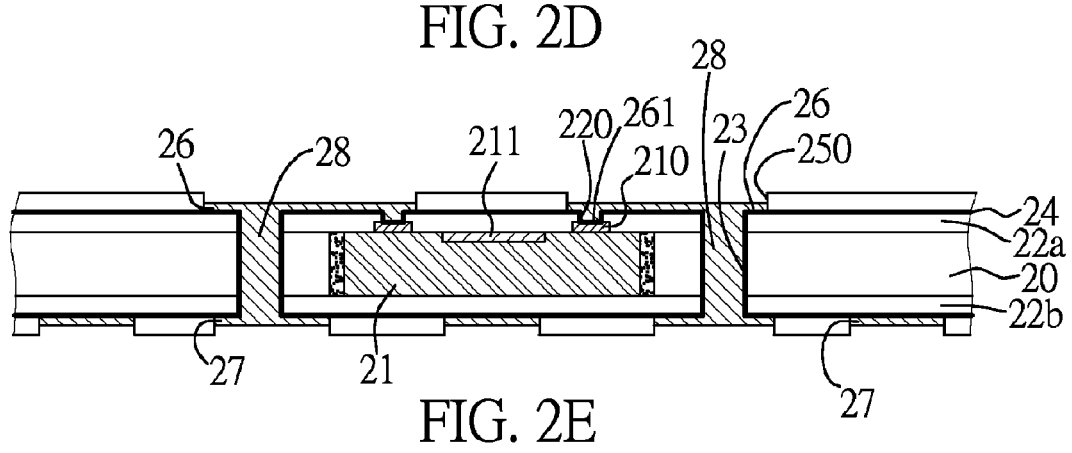

As shown in FIG. 2E, the conductive seed-layer 24 is mainly used as a current conductive pathway required for electroplating. A first circuit layer 26 is formed on the conductive seed-layer 24 on the first dielectric layer 22a in the open areas 250, and first conductive vias 261 are formed on the conductive seed-layer 24 in the vias 220 for electrically connecting the first circuit layer 26 and the electrode pads 210. Also, a second circuit layer 27 is formed on the conductive seed-layer 24 on the second dielectric layer 22b in the open areas 250, and a plurality of conductive through holes 28 are formed on the conductive seed-layer 24 in the through holes 23 for electrically connecting the first circuit layer 26 and the second circuit layer 27. In practice, the first circuit layer 26 and the second circuit layer 27 are preferably made of copper (Cu) due to its well-developed application in electroplating and relatively low cost. However, other electroplating metals are possible.

There have been numerous methods described for fabricating the conductive through holes 28 that are commonly known in the industry. Hence, the process to form the conductive through holes 28, which is briefly illustrated in the drawings, is not relevant to the technical features of the present invention, thus not necessary to be described in detail.

Figure 2F:
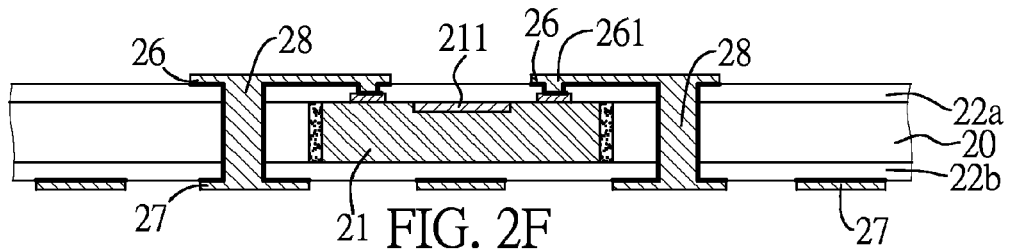
Figure 2G:
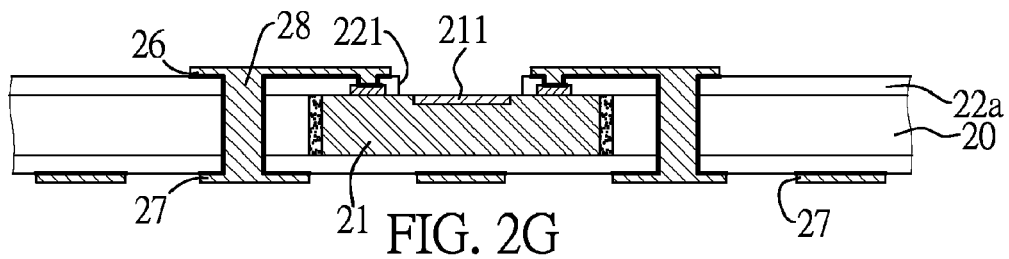

FIGS. 2F and 2G show the step of forming a light-permeable window 221 in the first dielectric 22a after removing the resist layer 25 and the conductive seed-layer 24 covered by the resist layer 25 to expose the photosensitive portion 211 of the semiconductor chip 21.

Figure 2H:
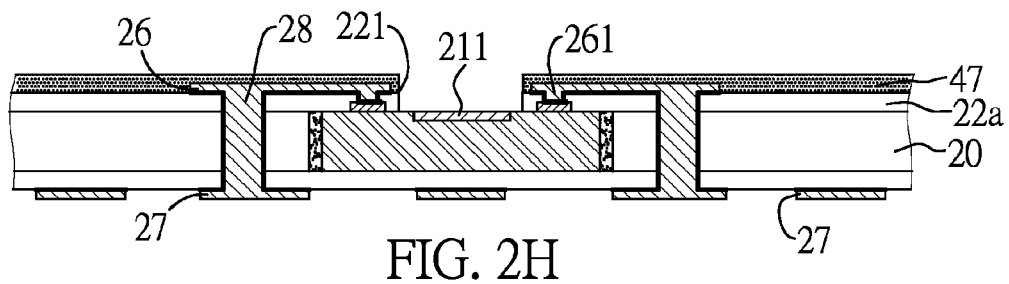
Figure 2I:
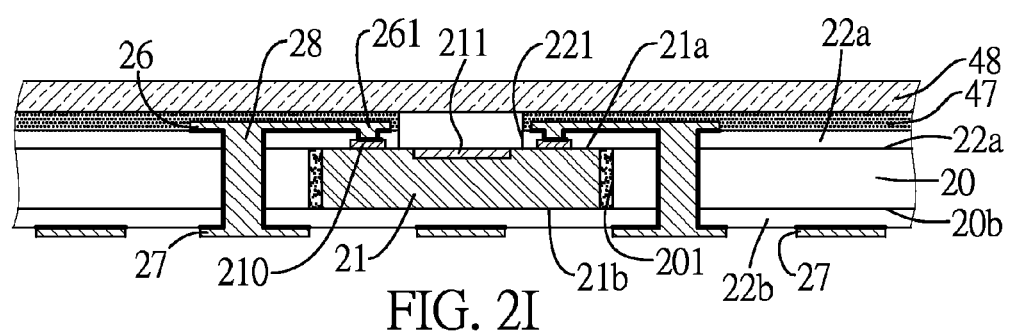

Next, referring to FIGS. 2H and 2I, an adhesive layer 47 is formed on the first circuit layer 26 and the first dielectric layer 22a, and a light-permeable layer 48 is attached onto the adhesive layer 47 to seal the light-permeable window 221. According to the present embodiment, the light-permeable layer 47 is made of glass in order for light to penetrate through the light-permeable layer 48 and reach the photosensitive portion 211, but it is not limited thereto.

Figure 2J:
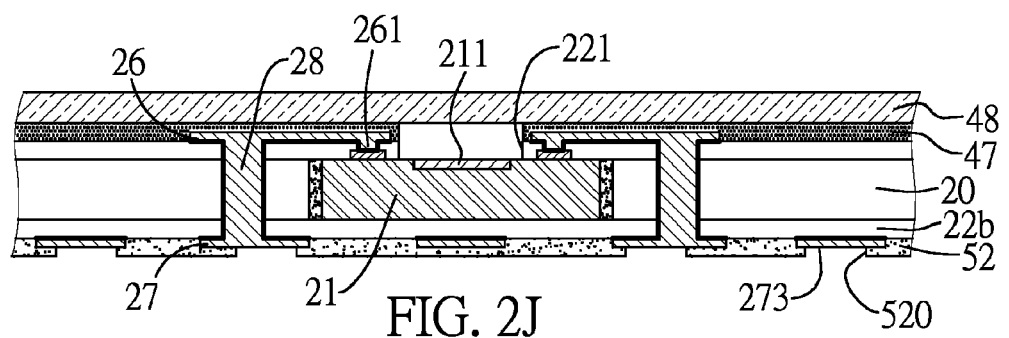
Figure 2K:
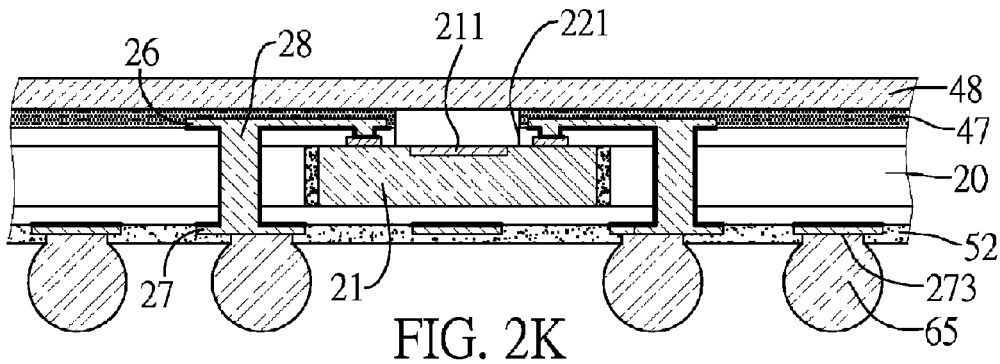
Figure 2J:
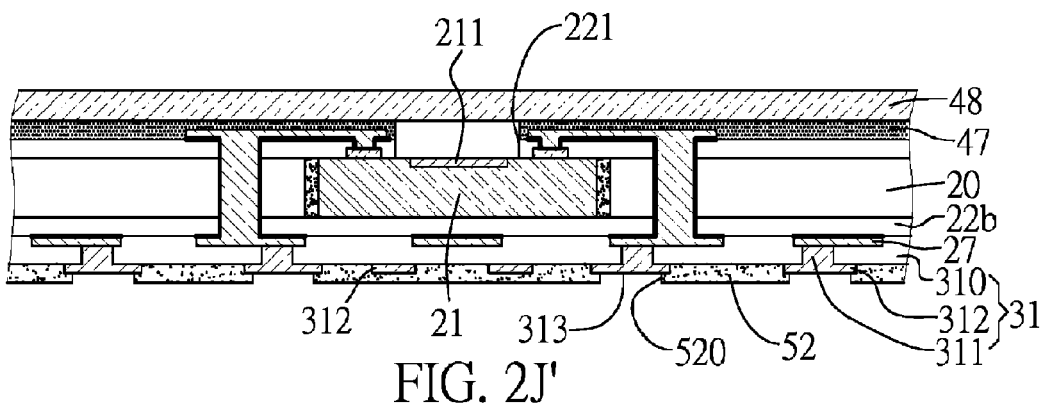
Figure 2K:
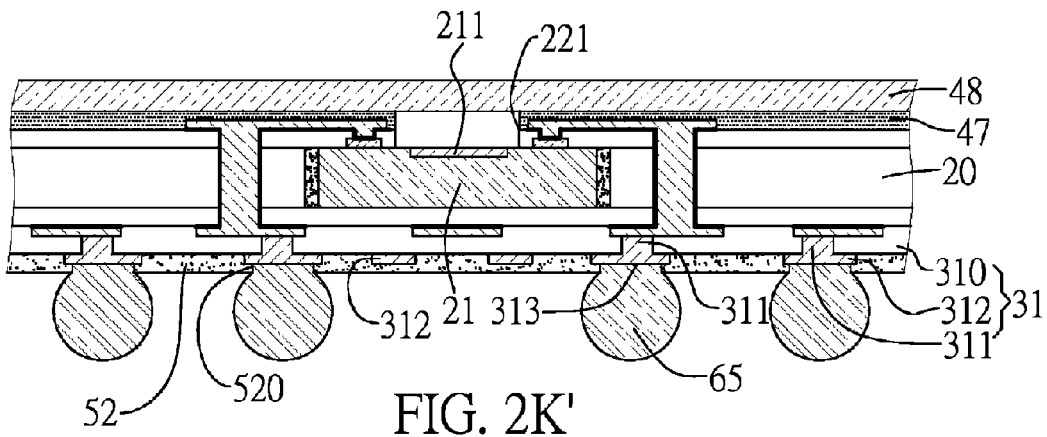

As shown in FIGS. 2J and 2K, a solder mask layer 52 is formed on the second circuit layer 27 and the second dielectric layer 22b, and formed with a plurality of openings 520 to expose portions of the second circuit layer 27 to serve as conductive pads 273, which are further formed with solder balls 65 on them to serve for electrically connecting to external electronics devices, such as a printed circuit board.

In an alternative embodiment as indicated in FIGS. 2J' and 2K' that pick up in sequence after FIG. 2I, a built-up structure 31 is formed on the second dielectric layer 22b and the second circuit layer 27. Similarly, descriptions of numerous fabrication techniques for a built-up structure 31 are omitted herein since they are commonly known in the industry and are not relevant to the technical features of the present invention.

The built-up structure 31 comprises at least a third dielectric layer 310 disposed on the second dielectric layer 22b and the second circuit layer 27, a third circuit layer 312 disposed on the third dielectric layer 310, and a plurality of second conductive vias 311 electrically connecting the second circuit layer 27 to the third circuit layer 312. Moreover, a solder mask layer 52 having a plurality of openings 520 is formed on the built-up structure 31 to expose portions of the outermost third circuit layer 312 to serve as conductive pads 313. The conductive pads 313 could further be combined with solder balls 65 to serve for electrical connection to external electronics devices.

In contrast to the conventional technique, the fabrication method offered by the present invention can decrease the overall height of the packaging structure by embedding the semiconductor chip 21 into the core board 20. Additionally, there is no need for using conducting wires since the semiconductor chip 21 can be electrically connected to the core board 20 through the conductive through holes 28 and the first and second circuit layers 26 and 27, thus further reducing the overall height of the packaging structure.

In addition, since there is no need to form a dam due to providing the adhesive layer 47 on the first dielectric layer 22a, and so it is unnecessary to prearrange space on the core board. As a result, both the height and the overall layout area of the packaging substrate are reduced. Moreover, in the absence of a dam, pressure imposing upon the edges of core boards will no longer exist.

The present invention further provides a packaging substrate having an embedded semiconductor chip, comprising: a core board 20 having a first surface 20a and an opposite second surface 20b, and a through cavity 201 penetrating the first and second surfaces 20a, 20b; the embedded semiconductor chip 21 disposed in the through cavity 201 and having an active surface 21a and an opposite inactive surface 21b, the active surface 21a having a photosensitive portion 211 and a plurality of electrode pads 210 and being at the same side as the first surface 20a of the core board 20, while the inactive surface 21a being at the same side as the second surface of the core board 20; a first dielectric layer 22a disposed on the active surface 21a and the first surface 20a of the core board 20, having a light-permeable window 221 to expose the photosensitive portion 211; a first circuit layer 26 disposed on the first dielectric layer 22a and having a plurality of first conductive vias 261 disposed in the first dielectric layer 22a for electrically connecting to a plurality of electrode pads 210; a second dielectric layer 22b disposed on the inactive surface 21b and the second surface 20b of the core board 20; a second circuit layer 27 disposed on the second dielectric layer 22b; and a plurality of conductive through holes 28 penetrating the core board 20 and the first and second dielectric layers 22a, 22b and electrically connecting the first and second circuit layers 26, 27.

The above-mentioned packaging substrate with an embedded semiconductor chip may further be disposed with an adhesive layer 47 and a light-permeable layer 48. The adhesive layer 47 is disposed on the first dielectric layer 22a and the first circuit layer 26, while the light-permeable layer 48 is disposed on the adhesive layer 47 to seal the light-permeable window 221.

Moreover, the packaging substrate of the present invention includes a solder mask layer 52 disposed on the second dielectric layer 22b and the second circuit layer 27, with a plurality of openings 520 to expose portions of the second circuit layer 27, which serves as conductive pads 273.

In another embodiment, the packaging substrate also comprises a built-up structure 31 disposed on the second dielectric layer 22b and the second circuit layer 27, which has at least one third dielectric layer 310 disposed on the second dielectric layer 22b and the second circuit layer 27, a third circuit layer 312 disposed on the third dielectric layer 310, and a plurality of conductive vias 311 to electrically connect the second circuit layer 27 and the third circuit layer 312. Additionally, a solder mask layer 52 is disposed on the built-up structure 31, the solder mask layer 52 having a plurality of openings 520 to expose portions of the outermost third circuit layer 312 to serve as conductive pads 313.

Finally, solder balls 65 can be disposed on the conductive pads 313 to serve for electrically connecting to external electronics devices.

In conclusion, the present invention provides a packaging substrate having a semiconductor chip embedded into a core board and the fabrication method thereof without the need of using wires and a dam, such that the total volume can be reduced effectively to satisfy the demand of being integrated into miniaturized electronics products. Moreover, the warp effect will be eliminated on the packaging substrate because pressure imposing upon the edges of the core boards coming from the dam can be completely avoided.

The above-described descriptions of the detailed embodiments are only to illustrate the preferred implementation according to the present invention, and are not intended to limit the scope of the present invention. Accordingly, various modifications and variations completed by those with ordinary skill in the art should fall within the scope of present invention defined in the appended claims.

What is claimed is:

1. A packaging substrate having an embedded semiconductor chip, comprising:
    a core board having a first surface and an opposite second surface, and a through cavity penetrating the first and second surfaces;
    the embedded semiconductor chip disposed in the through cavity and having an active surface and an opposite inactive surface, the active surface having a photosensitive portion and a plurality of electrode pads and being at a same side as the first surface of the core board, while the inactive surface being at a same side as the second surface of the core board;
    a first dielectric layer formed on the active surface and the first surface of the core board, the first dielectric layer having a light-permeable window to expose the photosensitive portion of the embedded semiconductor chip;
    a first circuit layer formed on the first dielectric layer and having a plurality of first conductive vias disposed in the first dielectric layer for electrically connecting to the electrode pads;
    a second dielectric layer formed on the inactive surface and the second surface of the core board;
    a second circuit layer formed on the second dielectric layer; and
    a plurality of conductive through holes penetrating the core board and the first and second dielectric layers, and electrically connecting the first and second circuit layers.

2. The packaging substrate having an embedded semiconductor chip of claim 1, wherein an adhesive fills the gap between the walls of the through cavity and the semiconductor chip.

3. The packaging substrate having an embedded semiconductor chip of claim 1, further comprising an adhesive layer and a light-permeable layer, the adhesive layer being disposed on the first dielectric layer and the first circuit layer, and the light-permeable layer being disposed on the adhesive layer to seal the light-permeable window.

4. The packaging substrate having an embedded semiconductor chip of claim 3, wherein the light-permeable layer is made of glass.

5. The packaging substrate having an embedded semiconductor chip of claim 1, further comprising a solder mask layer disposed on the second dielectric layer and the second circuit layer and having a plurality of openings to expose portions of the second circuit layer to serve as conductive pads.

6. The packaging substrate having an embedded semiconductor chip of claim 1, further comprising a built-up structure disposed on the second dielectric layer and the second circuit layer and having at least a third dielectric layer, a third circuit layer disposed on the third dielectric layer, and a plurality of second conductive vias electrically connecting the second circuit layer and the third circuit layer, wherein a solder mask layer is formed on the built-up structure, the solder mask layer having a plurality of openings to expose portions of the outermost third circuit layer to serve as conductive pads.

* * * * *